(12) United States Patent
Fabiano et al.

(10) Patent No.: US 10,826,448 B2
(45) Date of Patent: Nov. 3, 2020

(54) TRANS-IMPEDANCE AMPLIFIER (TIA) WITH A T-COIL FEEDBACK LOOP

(71) Applicant: Inphi Corporation, Santa Clara, CA (US)

(72) Inventors: Ivan Fabiano, Pavia (IT); Enrico Monaco, Modena (IT)

(73) Assignee: INPHI CORPORATION, San Jose, CA (US)

( * ) Notice: Subject to any disclaimer, the term of this patent is extended or adjusted under 35 U.S.C. 154(b) by 35 days.

(21) Appl. No.: 16/298,945

(22) Filed: Mar. 11, 2019

(65) Prior Publication Data

US 2020/0295720 A1 Sep. 17, 2020

(51) Int. Cl.
*H03F 3/08* (2006.01)
*H03F 3/45* (2006.01)

(52) U.S. Cl.
CPC .... *H03F 3/45179* (2013.01); *H03F 2200/117* (2013.01); *H03F 2200/129* (2013.01); *H03F 2200/36* (2013.01); *H03F 2203/45116* (2013.01); *H03F 2203/45516* (2013.01)

(58) Field of Classification Search
CPC ....................................................... H03F 3/08
USPC ............................... 330/308, 79; 250/214 A
See application file for complete search history.

(56) References Cited

U.S. PATENT DOCUMENTS

| | | | | |
|---|---|---|---|---|
| 1,904,524 A | * | 4/1933 | Posthumus | H03F 1/36 330/79 |
| 2,775,655 A | * | 12/1956 | Lansu | H03G 3/08 330/78 |
| 3,128,436 A | * | 4/1964 | Anderson | H03F 1/36 330/79 |
| 8,766,728 B2 | * | 7/2014 | Ito | H03F 3/08 330/278 |
| 9,755,577 B2 | * | 9/2017 | Amir Firouzkouhi | H03F 1/3205 |
| 2018/0059339 A1 | * | 3/2018 | Gupta | G02B 6/425 |
| 2018/0364332 A1 | * | 12/2018 | Stann | G01S 7/4816 |

* cited by examiner

*Primary Examiner* — Henry Choe
(74) *Attorney, Agent, or Firm* — Richard T. Ogawa; Ogawa P.C.

(57) ABSTRACT

A transimpedance amplifier includes a T-coil in its feedback loop to expand its bandwidth. The transimpedance amplifier includes an amplifier that converts and amplifies an input current signal to an intermediary voltage signal. One terminal of the T-coil is coupled to a resistor in the feedback loop which is coupled to the input of the amplifier. Another terminal of the T-coil is coupled to the output of an amplifier. The bridge point of the T-coil is coupled to the output terminal of the transimpedance amplifier which outputs an output voltage. The T-coil includes two inductors that are mutually coupled such that a current is induced to compensate for the leakage current caused by the parasitic capacitance of the transimpedance amplifier.

20 Claims, 4 Drawing Sheets

TRANS-IMPEDANCE AMPLIFIER (TIA) WITH A T-COIL FEEDBACK LOOP

BACKGROUND

1. Field of the Disclosure

This disclosure pertains in general to digital receiver, and more specifically to trans-impedance amplifier (TIA) bandwidth extension.

2. Description of the Related Art

With the advancement in technology, communication systems now operate at higher and higher data speeds. Trans-impedance amplifiers (TIAs) convert analog input current signals to voltages and are vital in receiver systems. One of the challenges in designing TIAs is therefore to increase the bandwidth to meet the data speed requirements.

SUMMARY

A trans-impedance amplifier includes a T-coil in its feedback loop to expand its bandwidth. The TIA converts an input current into an output voltage. One terminal of the T-coil is coupled to a resistor in the feedback loop which is coupled to the input of the amplifier. Another terminal of the T-coil is coupled to the output of an amplifier. The bridge point of the T-coil is coupled to the output terminal of the trans-impedance amplifier which outputs an output voltage. The T-coil includes two inductors that are mutually coupled such that a current is induced to compensate for the current caused by the parasitic capacitance of the trans-impedance amplifier and the load. As a result, the signal conversion speed is increased and the bandwidth is expanded.

Other aspects include components, devices, systems, improvements, methods, processes, applications and other technologies related to the foregoing.

BRIEF DESCRIPTION OF THE DRAWINGS

The teachings of the embodiments disclosed herein can be readily understood by considering the following detailed description in conjunction with the accompanying drawings.

DETAILED DESCRIPTION

The Figures and the following description relate to various embodiments by way of illustration only. It should be noted that from the following discussion, alternative embodiments of the structures and methods disclosed herein will be readily recognized as viable alternatives that may be employed without departing from the principles discussed herein. Reference will now be made in detail to several embodiments, examples of which are illustrated in the accompanying figures. It is noted that wherever practicable similar or like reference numbers may be used in the figures and may indicate similar or like functionality.

Figure 1A:
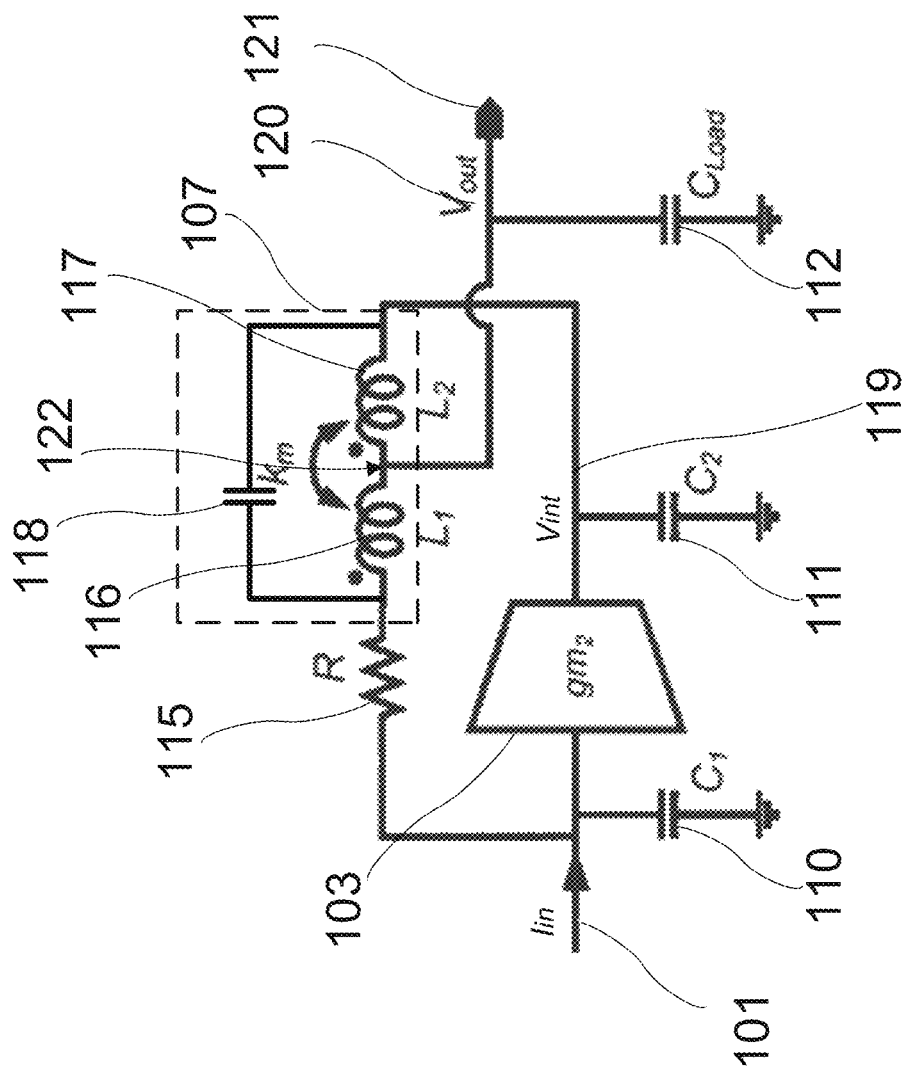
FIG. 1A illustrates a block diagram of an example trans-impedance amplifier (TIA), according to one embodiment.

FIG. 1A illustrates a block diagram of an example transimpedance amplifier (TIA) 100, according to one embodiment. The TIA 100 converts an input current signal Iin 101 to an output voltage signal Vout 120. The input current signal Iin 101 can be generated by a photodiode or a trans-conductance according to an input voltage. The TIA 100 includes an amplifier 103, a resistor 115, and a T-coil 107 including inductors 116-117 and a bridge capacitor 118. The inductors 116-117 are mutually coupled by a coupling coefficient $k_m$ and coupled to form the T-coil 107. The output terminal 121 of the TIA 100 is coupled to the bridge point 122 of the T-coil 107 where the inductors 116-117 are connected. The resistor 115 and the T-coil 107 are coupled between the output of the amplifier 103, the output terminal 121, and the input of the amplifier 103 to create a feedback loop. In particular, one terminal of the resistor 115 is coupled to the input terminal of the amplifier 103. The output terminal of the amplifier 103 is coupled to one terminal of the inductor 117 of which the other terminal is coupled to bridge point 122 where one terminal of the inductor 116 is coupled. The other terminal of the inductor 116 is coupled to one terminal of the resistor 115 of which the other terminal is coupled to the input terminal of the amplifier 103. The amplifier 103 converts the input current signal Iin 101 to an intermediary voltage signal Vint 119, which is provided back to the input terminal of the amplifier 103 via the feedback loop consisting of the resistor 115 and inductors 116-117 as described above.

The inductors 116-117 are mutually coupled such that a change in the current into the T-coil 107 through the inductor 116 induces a current that flows in the opposite direction through the inductor 117. That is, a change in the current that flows into the T-coil 107 through the inductor 116 induces a current that flows through the inductor 117 into the T-coil 107. The inductors 116-117 may have the same inductance and the induced current has the same amplitude as the change in the current. As further described below in connection with FIGS. 2A-2B, the feedback loop including the inductors 116-117 expands the bandwidth of the TIA 100. The inductors 116-117 substantially minimize or reduce the limit on the bandwidth that is caused by parasitic capacitances. In the illustrated example, the TIA 100 has an input parasitic capacitance 110 and an output parasitic capacitance 111.

Figure 2A:
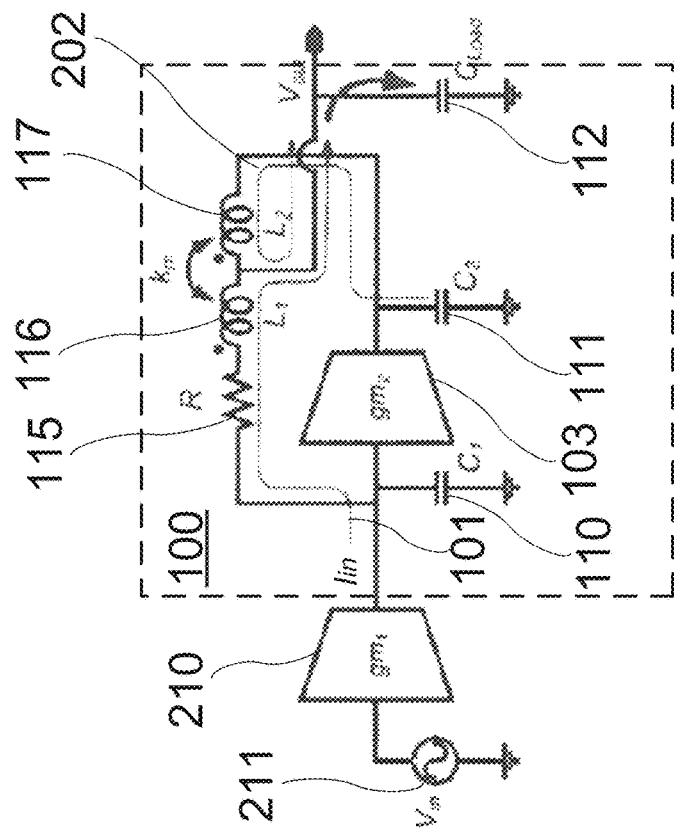
FIG. 2A illustrates a current flowing in an example TIA operating in the low frequency mode, according to one embodiment.

If the TIA 100 operates in the low-frequency mode to amplify incoming low-frequency signals, the inductors 116-117 appear to have very low impedance and the parasitic capacitances 110-112 appear to have very high impedance. The load capacitance $C_{LOAD}$ 112 which is the input capacitance of the subsequent stages of the receiver also appears to have very high impedance. The TIA's gain can be represented according to Equation (1):

$$\frac{V_{out}}{I_{in}} = \frac{1 - gm_2 \times R}{gm_2} \approx -R, \qquad (1)$$

where $gm_2$ represents the transimpedance of the amplifier 103. As illustrated in FIG. 2A, the input current Iin flows through the resistor 115 and inductors 116-117 to the output terminal of the amplifier 103. In this example, the input current is generated by a transconductance 210 based on a voltage 211.

Figure 2B:
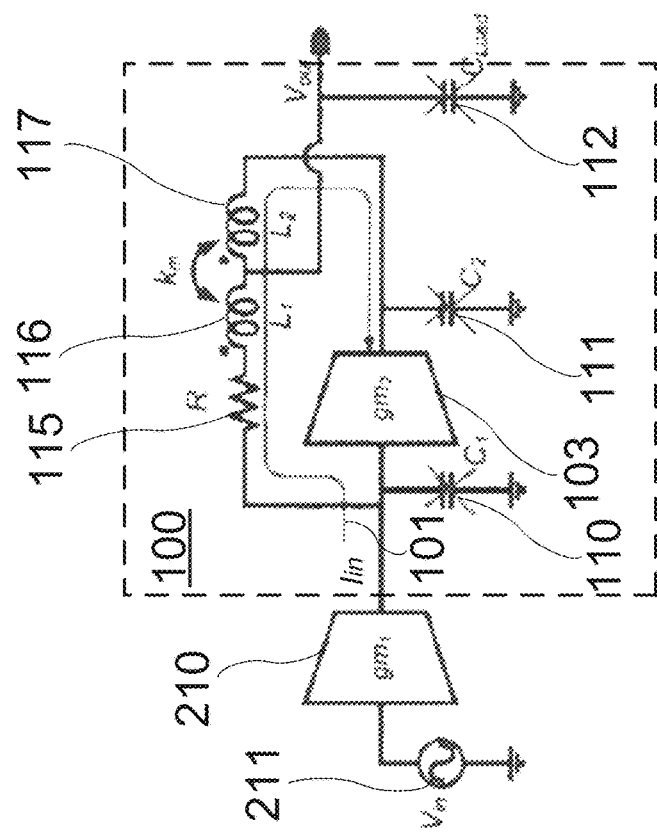
FIG. 2B illustrates a current flowing in an example TIA operating in the high frequency mode, according to one embodiment.

If the TIA 100 operates in the high-frequency mode to amplify incoming high-frequency signals, the inductors 116-117 appear to have high impedance and the parasitic capacitances 110-112 appear to have very low impedance. The parasitic capacitances 110-112 causes undesired current which reduces the load current and constrains the signal conversion speed. The maximum speed of the TIA 100 is limited by the total capacitance of the output parasitic capacitance $C_2$ 111 and the load capacitance $C_{LOAD}$ 112 because this total capacitance is much higher than the input parasitic capacitance $C_1$ 110. As illustrated in FIG. 2B, the input current 101 flows through the resistor 115 and the inductor 116 towards the output terminal of the TIA 100. Due to the mutual coupling between the inductors 116-117, the change in the input current 101 induces the inductor 117 to generate the current 202 that has an opposite direction as the change in the input current 101. Assuming that the inductors 116-117 have the same inductance, the current 202 has the same amplitude as the change in the current flowing through the inductor 116 which is the input current 101. The induced current 202 flows through the output parasitic capacitance C2 111. As such, the current flowing through the load capacitance $C_{LOAD}$ 112 is twice the input current 101. The output voltage to input current gain of the TIA 100 is therefore increased. With the increase in signal frequency, the LC network consisting of the inductor 117, output parasitic capacitance $C_2$ 111, and load capacitance $C_{LOAD}$ 112 resonates and as a result, a higher current flows through the inductor 117 into the load capacitance $C_{LOAD}$ 112. As a result, the bandwidth of the TIA 100 is extended.

Figure 1B:
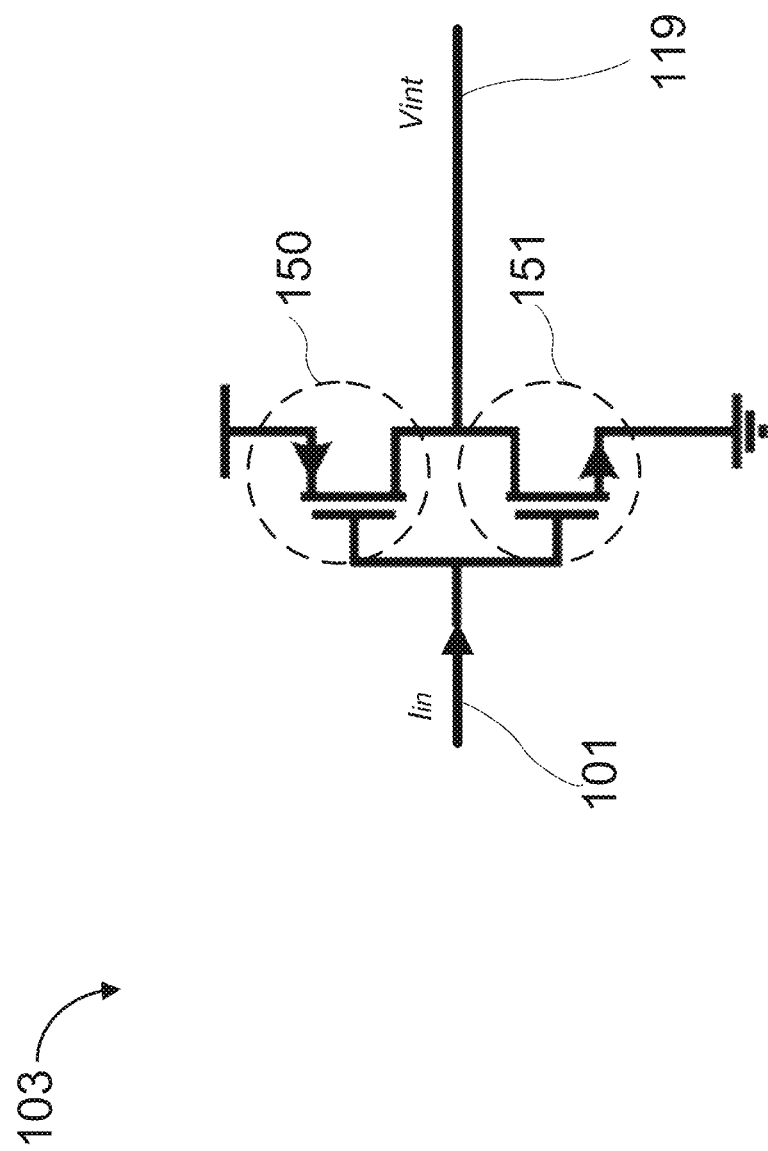
FIG. 1B is a circuit diagram illustrating an example amplifier, according to one embodiment.

FIG. 1B is a circuit diagram illustrating an example amplifier 103, according to one embodiment. The amplifier 103 is based on a CMOS inverter structure that includes MOSFETs 150, 151. In the illustrated example, the drains of the MOSFETs 150, 151 are connected together, and the sources of the MOSFETs 150, 151 are coupled to a DC voltage and ground, respectively. The gates of the MOSFETs 150, 151 are connected together to receive the input current signal Iin 101, and the intermediary voltage signal Vint 119 can be obtained from the drains of the MOSFETs 150, 151.

Figure 3A:
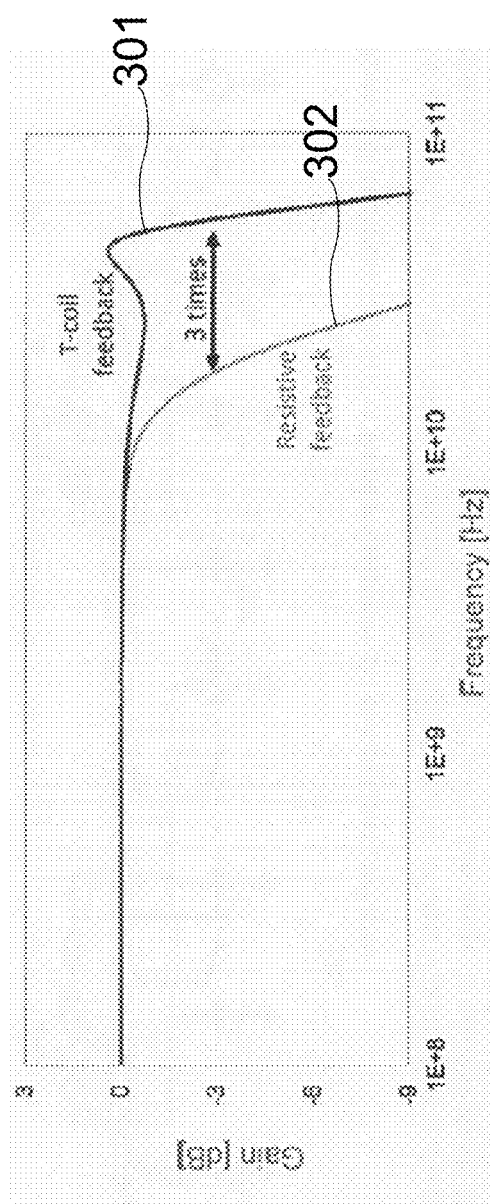
FIG. 3A illustrates transfer functions of two TIAs.
Figure 3B:
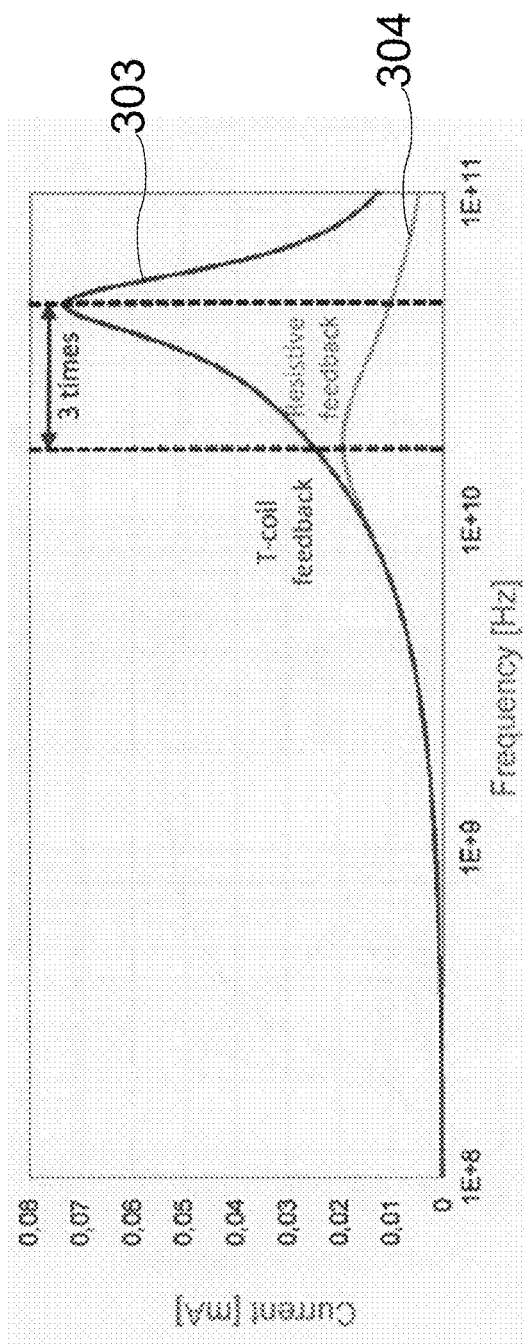
FIG. 3B illustrates load currents of two TIAs.

FIGS. 3A-B illustrate transfer functions and load current of two different TIAs: a first TIA of which the feedback loop includes a T-coil and a second TIA of which the feedback loop includes a resistor. Other than including the T-coil in the feedback loop, the rest of the two TIAs are identical. As illustrated in FIG. 3A, the curve 301 is the transfer function of the first TIA including the T-coil feedback loop and the curve 302 is the transfer function of the second TA including the resistive feedback loop. As illustrated in FIGS. 3A-B, including the T-coil in the feedback loop can extend the bandwidth of the TIA to three times of that of the TIA including only the resistive feedback loop. As illustrated in FIG. 3B, compared to the curve 304, the curve 303 has a higher amplitude in a specific frequency range indicating that the current into the load can be increased in the specific frequency range. Compared to conventional TIAs, TIAs as described herein have more current for a specific range of frequency extending the bandwidth without any increase in the power consumption. As such, the data speed is increased without any secondary active circuit.

The TIA 100 can be implemented in transceivers or receivers of different designs that operate in different frequency ranges. The TIA 100 itself and one or more components of a receiver can be implemented in one semiconductor die.

Upon reading this disclosure, those of skill in the art will appreciate still additional alternative designs. Thus, while particular embodiments and applications of the present disclosure have been illustrated and described, it is to be understood that the embodiments are not limited to the precise construction and components disclosed herein and that various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:

1. A semiconductor product comprising a transimpedance amplifier including:
    an input terminal to receive an input current;
    an output terminal to output an output voltage;
    an amplifier coupled to the input terminal and configured to convert and amplify the input current to the output voltage; and
    a feedback loop coupled between the input terminal and the output terminal, the feedback loop including a resistor and a T-coil coupled in series, the resistor coupled between the input terminal and a first terminal of the T-coil, a second terminal of the T-coil coupled to an output of the amplifier, and a third terminal of the T-coil coupled to the output terminal of the transimpedance amplifier;
    wherein the T-coil includes a first inductor and a second inductor mutually coupled such that a change in a first current through the first inductor causes a second current through the second inductor in an opposite direction as the change in the first current.

2. The semiconductor product of claim 1 comprising a semiconductor die including the transimpedance amplifier.

3. The semiconductor product of claim 1 wherein a first terminal of the first inductor is the first terminal of the T-coil, a second terminal of the first inductor coupled to a first terminal of the second inductor is the third terminal of the T-coil, and a second terminal of the second inductor is the second terminal of the T-coil.

4. The semiconductor product of claim 1 wherein the T-coil is configured such that a change in the input current induces a current flowing into the T-coil through the second terminal.

5. The semiconductor product of claim 1 wherein the first inductor and the second inductor have a same inductance.

6. The semiconductor product of claim 1 further comprising a capacitor coupled between the output of the amplifier and a ground.

7. The semiconductor product of claim 1 further comprising an input transconductance to convert an input voltage to the input current.

8. The semiconductor product of claim 1 further comprising a photodiode to convert light to the input current.

9. A transimpedance amplifier (TIA) device, the device comprising:
    an input terminal to receive an input current;
    an output terminal to output an output voltage;
    an amplifier coupled to the input terminal and configured to convert and amplify the input current to the output voltage; and
    a feedback loop coupled between the input terminal and the output terminal, the feedback loop including a resistor and a T-coil coupled in series, the resistor coupled between the input terminal and a first terminal of the T-coil, a second terminal of the T-coil coupled to an output of the amplifier, and a third terminal of the T-coil coupled to the output terminal of the transimpedance amplifier;

wherein the T-coil includes a first inductor and a second inductor mutually coupled such that a change in a first current through the first inductor causes a second current through the second inductor in an opposite direction as the change in the first current.

10. The device of claim 9 configured on a semiconductor die.

11. The device of claim 9 wherein a first terminal of the first inductor is the first terminal of the T-coil, a second terminal of the first inductor coupled to a first terminal of the second inductor is the third terminal of the T-coil, and a second terminal of the second inductor is the second terminal of the T-coil.

12. The device of claim 9 wherein the T-coil is configured such that a change in the input current induces a current flowing into the T-coil through the second terminal.

13. The device of claim 9 wherein the first inductor and the second inductor have a same inductance.

14. The device of claim 9 further comprising a capacitor coupled between the output of the amplifier and a ground.

15. The device of claim 9 further comprising an input transconductance to convert an input voltage to the input current.

16. The device of claim 9 further comprising a photodiode to convert light to the input current.

17. A transimpedance amplifier (TIA) device, the device comprising:
an input terminal to receive an input current;
an output terminal to output an output voltage;
an amplifier coupled to the input terminal and configured to convert and amplify the input current to the output voltage; and
a feedback loop coupled between the input terminal and the output terminal, the feedback loop including a resistor and a T-coil coupled in series, the resistor coupled between the input terminal and a first terminal of the T-coil, a second terminal of the T-coil coupled to an output of the amplifier, and a third terminal of the T-coil coupled to the output terminal of the transimpedance amplifier;

wherein the T-coil includes a first inductor and a second inductor mutually coupled such that a change in a first current through the first inductor causes a second current through the second inductor in an opposite direction as the change in the first current; and wherein the first inductor and the second inductor have a same inductance.

18. The device of claim 17 configured on a semiconductor die.

19. The device of claim 17 wherein a first terminal of the first inductor is the first terminal of the T-coil, a second terminal of the first inductor coupled to a first terminal of the second inductor is the third terminal of the T-coil, and a second terminal of the second inductor is the second terminal of the T-coil; and wherein the T-coil is configured such that a change in the input current induces a current flowing into the T-coil through the second terminal.

20. The device of claim 17 further comprising
a capacitor coupled between the output of the amplifier and a ground;
an input transconductance to convert an input voltage to the input current; and
a photodiode to convert light to the input current.

* * * * *